(12) United States Patent
Khanna et al.

(10) Patent No.: US 8,685,833 B2
(45) Date of Patent: Apr. 1, 2014

(54) STRESS REDUCTION MEANS FOR WARP CONTROL OF SUBSTRATES THROUGH CLAMPING

(75) Inventors: Vijayeshwar D. Khanna, Millwood, NY (US); Sri M. Sri-Jayantha, Ossining, NY (US)

(73) Assignee: International Business Machines Corporation, Armonk, NY (US)

( * ) Notice: Subject to any disclaimer, the term of this patent is extended or adjusted under 35 U.S.C. 154(b) by 99 days.

(21) Appl. No.: 13/437,309

(22) Filed: Apr. 2, 2012

(65) Prior Publication Data

US 2013/0260534 A1  Oct. 3, 2013

(51) Int. Cl.
*H01L 21/30* (2006.01)

(52) U.S. Cl.
USPC .................................. 438/457; 257/E21.122

(58) Field of Classification Search
USPC ............................ 438/457, 940; 257/E21.122
See application file for complete search history.

(56) References Cited

U.S. PATENT DOCUMENTS

| | | | |
|---|---|---|---|
| 6,103,551 A * | 8/2000 | Ono et al. | 438/108 |
| 6,528,352 B1 * | 3/2003 | Jackson et al. | 438/118 |
| 6,808,958 B2 * | 10/2004 | Light | 438/106 |
| 2011/0083786 A1 | 4/2011 | Guo et al. | |
| 2012/0045869 A1 | 2/2012 | Gaynes et al. | |

OTHER PUBLICATIONS

U.S. Appl. No. 13/036,086, filed Feb. 28, 2011, Entitled: "Flip Chip Assembly Method Employing Post-Contact Differential Heating" First Name Inventor: Rajneesh Kumar.

\* cited by examiner

*Primary Examiner* — Chandra Chaudhari
(74) *Attorney, Agent, or Firm* — Scully, Scott, Murphy & Presser, P.C.; Louis J. Percello, Esq.

(57) ABSTRACT

A method is provided for bonding a semiconductor chip to a packaging substrate while minimizing the variation in the solder ball heights and controlling the stress in the solder balls and the stress in the packaging substrate. During the solder reflow, the warp of the packaging substrate, including the absolute warp, thermal warp, and substrate to substrate variations of the warp, is constrained at a minimal level by providing a clamping constraint to the packaging substrate. During cool down of the solder balls, the stresses and strains of the solder joints are maintained at levels that do not cause tear of the solder joints or breakage of the packaging substrate by removing the clamping constraint. Thus, the bonding process provides both uniform solder height with minimized solder non-wets and stress minimization of the solder balls and the packaging substrate.

15 Claims, 9 Drawing Sheets

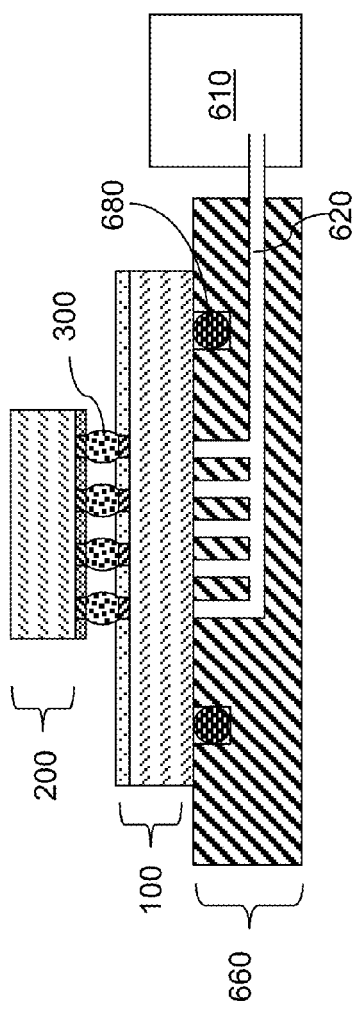
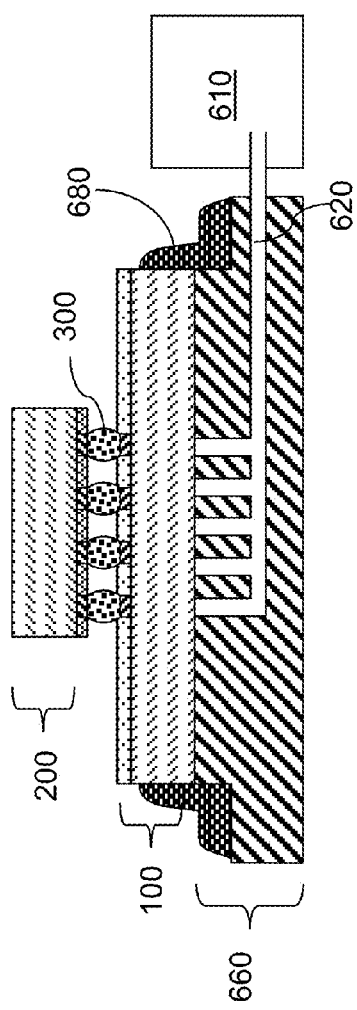
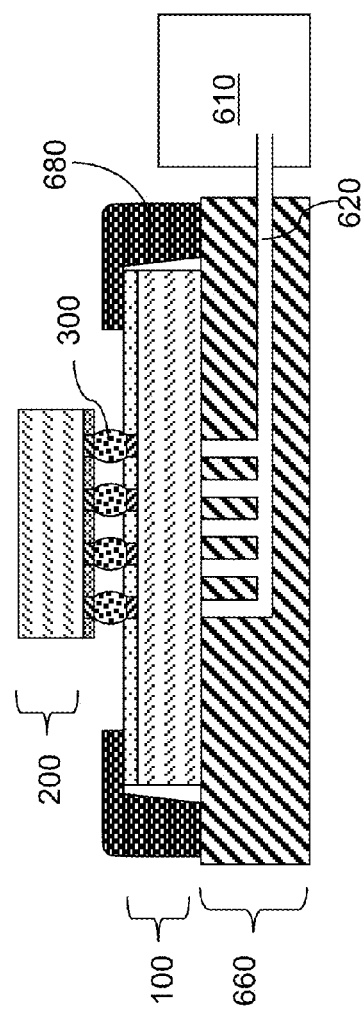

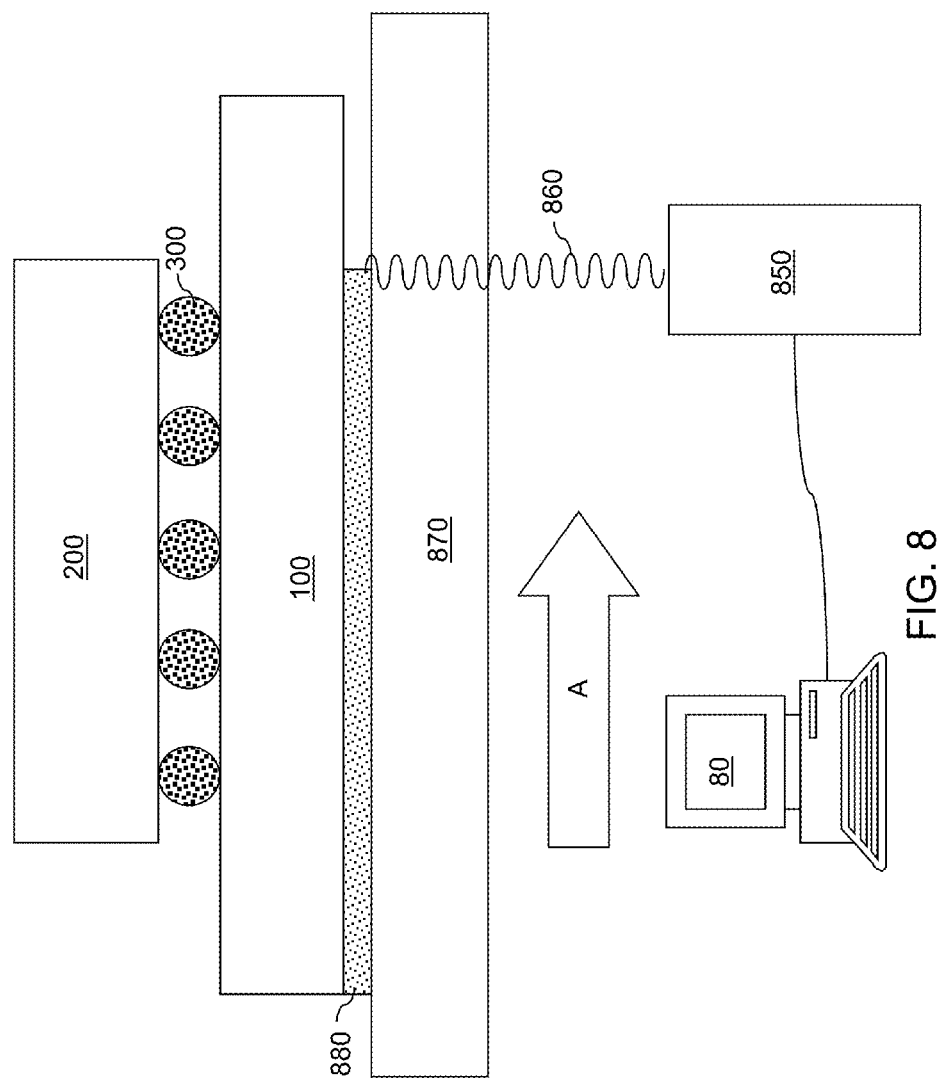

STRESS REDUCTION MEANS FOR WARP CONTROL OF SUBSTRATES THROUGH CLAMPING

BACKGROUND

The present disclosure relates to a method for bonding substrates, and particularly, to a method of bonding substrates while minimizing stress induced by a mismatch in the coefficients of thermal expansion (CTE's) between the substrates during a cool down step, and an apparatus for effecting the same.

Substrate warp poses a challenge for the attachment of a semiconductor chip to a packaging substrate using flip-chip technology. A large warp in magnitude at reflow is a cause for unreliable C4 bonding, leading to potential non-wets or unequal C4 solder heights. In addition, a large sample to sample variation (sigma) of warp is a problem during bond and assembly even for substrates having a nominal mean warp. The thermal warp, i.e., the change in warp with temperature, is another undesirable problem for bond and assembly. A large thermal warp means that the packaging substrate changes shape during the critical cool down period after the reflow of the solder balls. Such change in the shape of the substrate could lead to defects in the solder ball joints such as hot tears.

One solution to the warp problem is the use of a mechanical constraint in the form of a temporary glass carrier (TGC) throughout the bonding process, including the entire duration of the cool down period. In this example, the packaging substrate is attached, with an adhesive, to a thick flat glass plate under pressure such that the inherent absolute warp of the substrate is flattened out. Because of the mechanical constraint of the glass carrier, the absolute and thermal warps are reduced close to zero, and so is the sample to sample variation (sigma) of this warp. However, modeling studies have shown that the stresses and shear strains in the C4 balls and back-end-of-line (BEOL) metallurgy are increased by constraining the free movement in the Z-direction of the packaging substrate during the cool down process. The difference in the coefficients of thermal expansion (CTE's) between the packaging substrate and the semiconductor chip causes a differential contraction between the two during cooling. This results in the build-up of shear stresses in the C4 balls and the semiconductor chip.

The shear stresses in the C4 balls can be naturally minimized by the bending of the bonded assembly including the semiconductor chip and the packaging substrate if the bonded assembly is free to bend. If the free bending of the bonded assembly including the semiconductor chip and the packaging substrate is restricted by use of the TGC, the reduction of stresses and strains cannot be achieved. Limiting the free bending of the bonded assembly can thus lead to an effective increase in failures in the C4 balls and BEOL metallurgy.

A factor that can mitigate the increase in stresses and strains, while using a TGC, is the potential to constrain the X-Y expansion of the substrate and thereby reduce the effective CTE difference between the die and substrate. Modeling studies have shown that the CTE of the constrained packaging substrate has to be reduced by nearly 40% for the stresses to be lowered to the stresses for a packaging substrate that is free to bend. Measurements on actual TGC mounted substrates have shown that such a large reduction in CTE is very difficult to achieve, and is highly dependent on the adhesive being used. Soft adhesives allow slippage between the substrate and the glass, and do not achieve a sufficient reduction in CTE. Harder adhesives can reduce the CTE more, but result in either permanently deforming the substrate or breaking the glass.

The TGC also has the drawback of requiring an adhesive to attach the packaging substrate to the glass. The adhesive contributes to contamination of a ball grid array (BGA) or land grid array (LGA) side of the substrate. Due to this phenomenon, the TGC technique cannot be used with LGA substrates where contamination is not tolerable. The removal of the packaging substrate from the TGC is also an issue. The technique of shearing a bonded package off the TGC is stressful to the packaging substrate. Through substrate vias in the packaging substrate are particularly vulnerable to damage during this process.

BRIEF SUMMARY

A method is provided for bonding a semiconductor chip to a packaging substrate while minimizing the variation in the solder ball heights and controlling the stress in the solder balls and the stress in the packaging substrate. During the solder reflow, the warp of the packaging substrate, including the absolute warp, thermal warp, and substrate to substrate variations of the warp, is constrained at a minimal level by providing a clamping constraint to the packaging substrate. During cool down of the solder balls, the stresses and strains of the solder joints are maintained at levels that do not cause tear of the solder joints or breakage of the packaging substrate by removing the clamping constraint. Thus, the bonding process provides both uniform solder height with minimized solder non-wets and stress minimization of the solder balls and the packaging substrate.

According to an aspect of the present disclosure, a method of bonding substrates is provided, which includes: clamping a back side surface of a first substrate to a planar surface, wherein the back side surface remains coplanar with the planar surface while the first substrate is clamped; bonding the first substrate to a second substrate through an array of solder balls that contact by reflowing the array of solder balls at a reflow temperature, wherein the first substrate, the second substrate, and the array of solder balls form a bonded assembly; cooling the bonded assembly below the reflow temperature to a release temperature that is greater than room temperature while the back side surface of the first substrate remains clamped; and releasing of the clamping of the back side of the first substrate at the release temperature.

According to another aspect of the present disclosure, an apparatus for bonding substrates is provided. The apparatus includes: a heating means for heating an assembly of a first substrate, an array of solder balls, and a second substrate; a supporting means for supporting the first substrate, the supporting means including a planar surface; a clamping means for clamping a back side surface of the first substrate to the planar surface and configured to hold the back side surface coplanar with the planar surface while the first substrate is clamped; and a control means for releasing of the clamping of the back side of the first substrate at a release temperature that is greater than room temperature.

According to yet another aspect of the present disclosure, an apparatus for bonding substrates is provided. The apparatus includes: a heating means for heating an assembly of a first substrate, an array of solder balls, and a second substrate; a supporting means for supporting the first substrate, the supporting means including a planar surface; a release means for releasing a back side surface of the first substrate from the planar surface from a clamped state in which the back side surface is held to coincide with the planar surface while the first substrate is clamped; and a control means for activating the release means at a release temperature that is greater than room temperature.

According to still another aspect of the present disclosure, a substrate carrier is provided. The substrate carrier is configured to form an encapsulated vacuum enclosure therein by combining with at least one substrate in a geometry wherein either the back side or the front side surface of the at least one substrate is combined with surfaces of a cavity within the substrate carrier to form and seal the encapsulated vacuum enclosure. The substrate carrier can further include a vacuum release mechanism configured to break the sealed encapsulated vacuum enclosure.

BRIEF DESCRIPTION OF THE SEVERAL VIEWS OF THE DRAWINGS

FIG. 6A is a vertical cross-sectional views of a first exemplary assembly of a bonded substrate mounted to a substrate carrier according to an embodiment of the present disclosure.

FIG. 6B is a vertical cross-sectional views of a second exemplary assembly of a bonded substrate mounted to a substrate carrier according to an embodiment of the present disclosure.

FIG. 6C is a vertical cross-sectional views of a third exemplary assembly of a bonded substrate mounted to a substrate carrier according to an embodiment of the present disclosure.

FIG. 8 is a vertical cross-sectional view of an assembly of a bonded substrate, an adhesive layer, a transparent chuck, and an irradiation means configured to remove or deactivate the adhesive layer according to an embodiment of the present disclosure.

DETAILED DESCRIPTION

Figure 1:
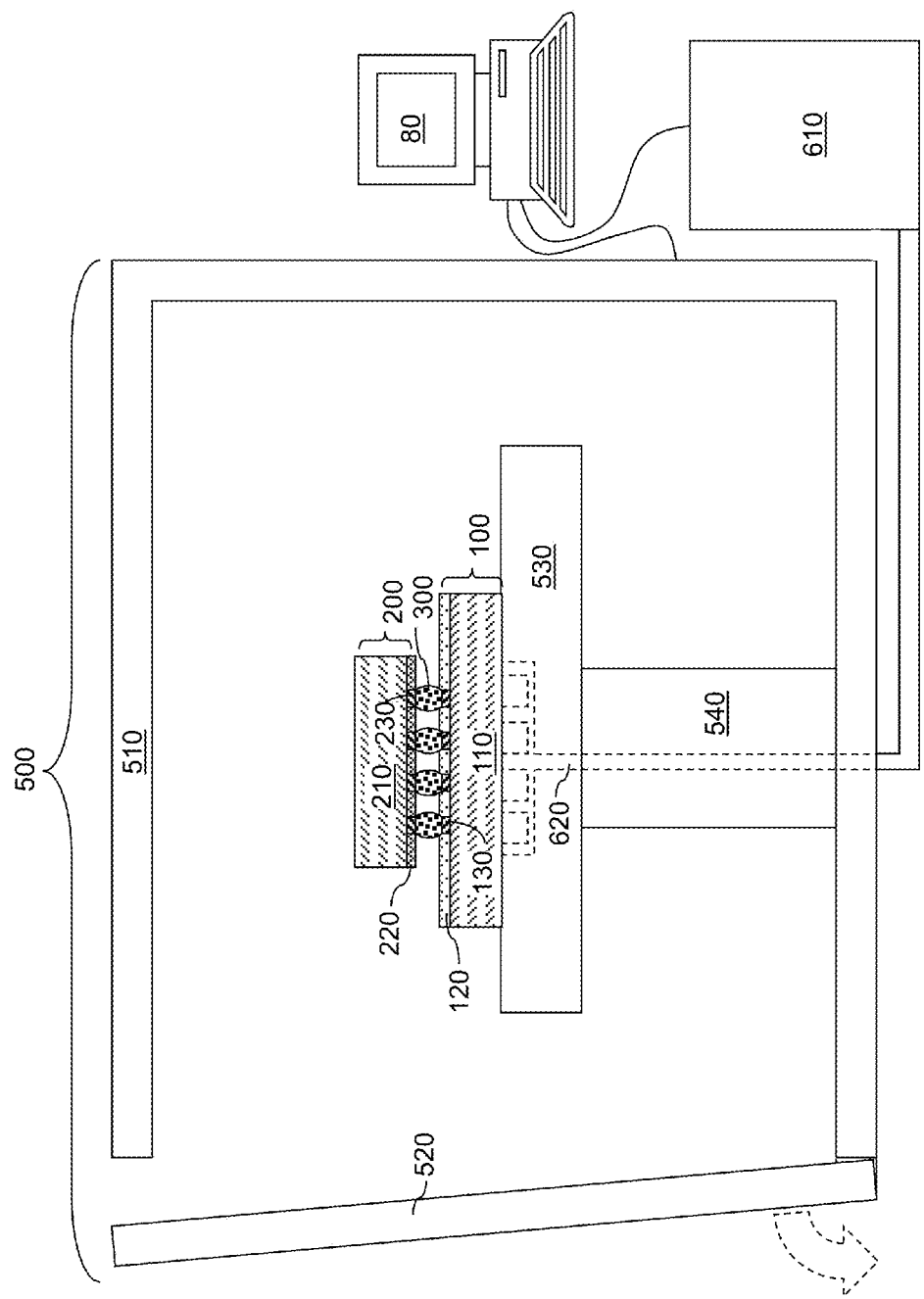
FIG. 1 is a schematic vertical cross-sectional view of a first exemplary apparatus that can be employed for bonding a first substrate to a second substrate according to a first embodiment of the present disclosure.

As stated above, the present disclosure relates to a method of bonding substrates while minimizing stress induced by a mismatch in the coefficients of thermal expansion (CTE's) between the substrates during a cool down step, and an apparatus for effecting the same, which are now described in detail with accompanying figures. It is noted that like and corresponding elements are referred to by like reference numerals. The drawings are not in scale.

In an embodiment of the present disclosure, the warp of a packaging substrate is controlled during reflow of solder balls, but is not constrained during a latter period of a cool down process. The combination of the two warp control methods allows planar alignment of solder balls at the time of bonding to minimize non-bonding of solder balls, and allows stresses in various portions of a bonded assembly including the packaging substrate, an array of solder balls, and a semiconductor substrate to be partially released by free bending of the substrate package during the latter period of the cool down process.

Referring to FIG. 1, a first exemplary apparatus according to a first embodiment of the present disclosure is illustrated, which can be employed for bonding a first substrate 100 to a second substrate 200.

The first substrate 100 can include a first substrate layer 110, a first surface dielectric layer 120, and an array of first bonding pads 130 embedded within the first surface dielectric layer 120. The first substrate 100 can be a packaging substrate or a semiconductor chip or an interposer. If the first substrate 100 is a packaging substrate, the first substrate 100 can include layers of wiring structures (metal interconnect structures), and can be a ceramic substrate, an organic laminated substrate, a silicone substrate, a metal substrate, or a flexible film substrate. If the first substrate 100 is a semiconductor chip, the first substrate 100 includes semiconductor devices therein.

The second substrate 200 includes a second substrate layer 210, a second surface dielectric layer 220, and an array of second bonding pads 230 embedded within the second surface dielectric layer 220. Each bonding pad within the array of second bonding pads 230 can be electrically connected to the layers of wiring within the second substrate 200. The second substrate 200 can be any of a semiconductor chip, an interposer, or a packaging substrate. Each bonding pad within the array of second bonding pads 230 can be electrically connected to at least one semiconductor device within the second substrate layer 210 through metal interconnect structures (not shown) embedded in the second substrate layer 210. The second substrate layer 210 includes semiconductor devices that can be, for example, field effect transistors, bipolar transistors, diodes, and/or optical semiconductor devices.

An array of solder balls 300 is bonded to one of the first substrate 100 and the second substrate 200. Specifically, the array of solder balls 300 is bonded either to the array of first bonding pads 130 or the array of second bonding pads 230. The other of the first substrate 100 and the second substrate 200 is aligned to the array of solder balls 300. Specifically, if the array of solder balls 300 is bonded to the array of first bonding pads 130, the second substrate 200 is aligned to the array of solder balls 300 such that the array of second bonding pads 230 is aligned to the array of solder balls 300. If the array of solder balls 300 is bonded to the array of second bonding pads 230, the first substrate 100 is aligned to the array of solder balls 300 such that the array of first bonding pads 130 is aligned to the array of solder balls 300. The first substrate 100, the array of solder balls 300, and the second substrate 200 form an aligned pre-bonding assembly that include two physically detachable structures, one of which includes a structure of the array of solder balls 300 and one of the first and second substrates (100, 200). The array of solder balls 300 can be an array of C4 balls.

The aligned pre-bonding assembly is placed in an enclosure 500, which can be a furnace including heating means (not shown explicitly). The enclosure 500 includes enclosure walls 510 and a door 520, which can be configured to form a sealed volume when the door 520 is shut. Alternatively, the enclosure 500 can have be an open-ended system that is configured to continuously process multiple aligned pre-bonding assemblies through a reflow process and a subsequent cool down process.

The heating means can be any type of heater element known in the art. The heating means can be embedded in the enclosure walls 510 and/or the door 520, located within the cavity of the enclosure 500, or located outside the enclosure walls 510 and the door 520. The heating means is configured to heat structures loaded within the enclosure 500. Thus, the heating means is configured to heat the assembly of the first substrate 100, the array of solder balls 300, and the second substrate 200. The enclosure 500 is configured to confine heat at least during a reflow process.

A vacuum chuck 530 can hold the first substrate 100 tightly in place during the heat-up cycle, during a solder reflow process, and during an initial period of the cool down cycle. The vacuum chuck 530 embeds a portion of a vacuum manifold 620, and has a top planar surface that supports the first substrate 100. Thus, the vacuum chuck 530 functions as a supporting means for supporting the first substrate 100 with a planar surface. Optionally, a pedestal 540 can be provided to mechanically support the vacuum chuck 530 depending on the configuration of the vacuum chuck 530. A vacuum pump 610 is connected to the vacuum manifold 620, which extends from the vacuum pump 610 to the top surface of the vacuum chuck 530.

The combination of the vacuum pump 610, the vacuum manifold 620, and the vacuum chuck 530 collectively functions as a clamping means for clamping the back side surface of the first substrate 100 to the planar top surface of the vacuum chuck 530. The vacuum pump 610 and the vacuum manifold 620 are configured to hold the back side surface of the first substrate 100 coplanar with the planar top surface of the vacuum chuck 530 while the first substrate 100 is clamped.

The aligned pre-bonding assembly is heated up above the melting temperature of the material of the array of solder balls 300 while the back side surface of the first substrate 100 is held flat against the planar top surface of the vacuum chuck 530. The clamping is provided by a vacuum suction provided to the back side surface of the first substrate 100. The vacuum suction is provided by the vacuum manifold 620 that extends from the vacuum pump 610 to the back side surface of the first substrate 100. Thus, the back side surface of the first substrate 100 is clamped to a planar surface, i.e., the planar top surface of the vacuum chuck. The back side surface of the first substrate 100 remains coplanar with the planar top surface of the vacuum chuck 530 while the first substrate 100 is clamped.

The array of solder balls 300 reflows above the melting temperature of the material of the array of solder balls 300, thereby wetting and bonding to both the first and second substrates (100, 200). The first substrate 100 is bonded to the second substrate 200 through the array of solder balls 300 by reflowing the array of solder balls 300 at the reflow temperature. The array of solder balls 300 contacts the front (top) surface of the first substrate 100. Upon cooling below the melting temperature of the material of the array of solder balls 300, a bonded assembly is formed, which includes the first substrate 100, the second substrate 200, and the array of solder balls 300 bonded to the first and second substrates (100, 200).

The bonded assembly (100, 200, 300) is cooled below the reflow temperature to a release temperature while the back side surface of the first substrate 100 remains clamped. The release temperature is greater than room temperature. As used herein, room temperature refers to a temperature range from 10 degrees Celsius and 35 degrees Celsius. The clamping of the back side of the first substrate 100 is released at the release temperature. The supporting means and the clamping means are configured to allow free bending of the assembly upon release of the clamping.

The vacuum chuck 530 is configured to release the first substrate 100 at an appropriate time during cool down. For example, the clamping of the back side of the first substrate 100 is released by venting the vacuum enclosure at the release temperature. Upon releasing of the clamping, the bonded assembly (100, 200, 300) is allowed to bend freely thereafter.

The timing of the release of clamping can be controlled by a control means 80, which can be, for example, a microprocessor, a microcontroller, or a computer. The control means 80 is configured to release the clamping of the back side of the first substrate 100 at the release temperature that is greater than room temperature. The control means 80 can be pre-programmed to release the clamping after a predefined time period following the reflow process. The predefined time period can be determined based on measured cooling characteristics of the enclosure 500. Alternately, the control means 80 can be configured to monitor the temperature of the enclosure 500 through sensors (not shown) and to control the operation of the vacuum pump 610 so that the vacuum pump 610 is turned off or the vacuum manifold 620 is vented at the release temperature.

The release temperature is selected to be a temperature between the melting temperature of the array of solder balls 300 and the upper limit of room temperature, i.e., 35 degrees Celsius. In one embodiment, the ratio of the difference between the release temperature and 25 degrees Celsius to the difference between a melting temperature of the array of solder balls and 25 degrees Celsius is from 0.50 to 0.90. In another embodiment, this ratio can be from 0.60 to 0.80. For example, if the melting temperature of the array of solder balls 300 is 225 degrees Celsius, the release temperature can be in a range from 125 degrees Celsius and 205 degrees Celsius, and optionally can be in a range from 145 degrees Celsius and 185 degrees Celsius.

Since the first substrate 100 is held by vacuum without employing any adhesive, contamination of the bonded assembly (100, 200, 300) by adhesive materials is prevented. Thus, both ball grid array (BGA) substrates and land grid array (LGA) substrates can be employed for the first substrate 100. Further, because the bonded assembly (100, 200, 300) remains in place only by gravity and friction between the bottom surface of the first substrate 100 and the top surface of the vacuum chuck 530, the bonded assembly (100, 200, 300) can be picked up after cool down. Thus, no external force for freeing the bonded assembly (100, 200, 300) is needed in contrast to other methods employing adhesives to fix the first substrate 100 in place during a bonding process.

Figure 2:
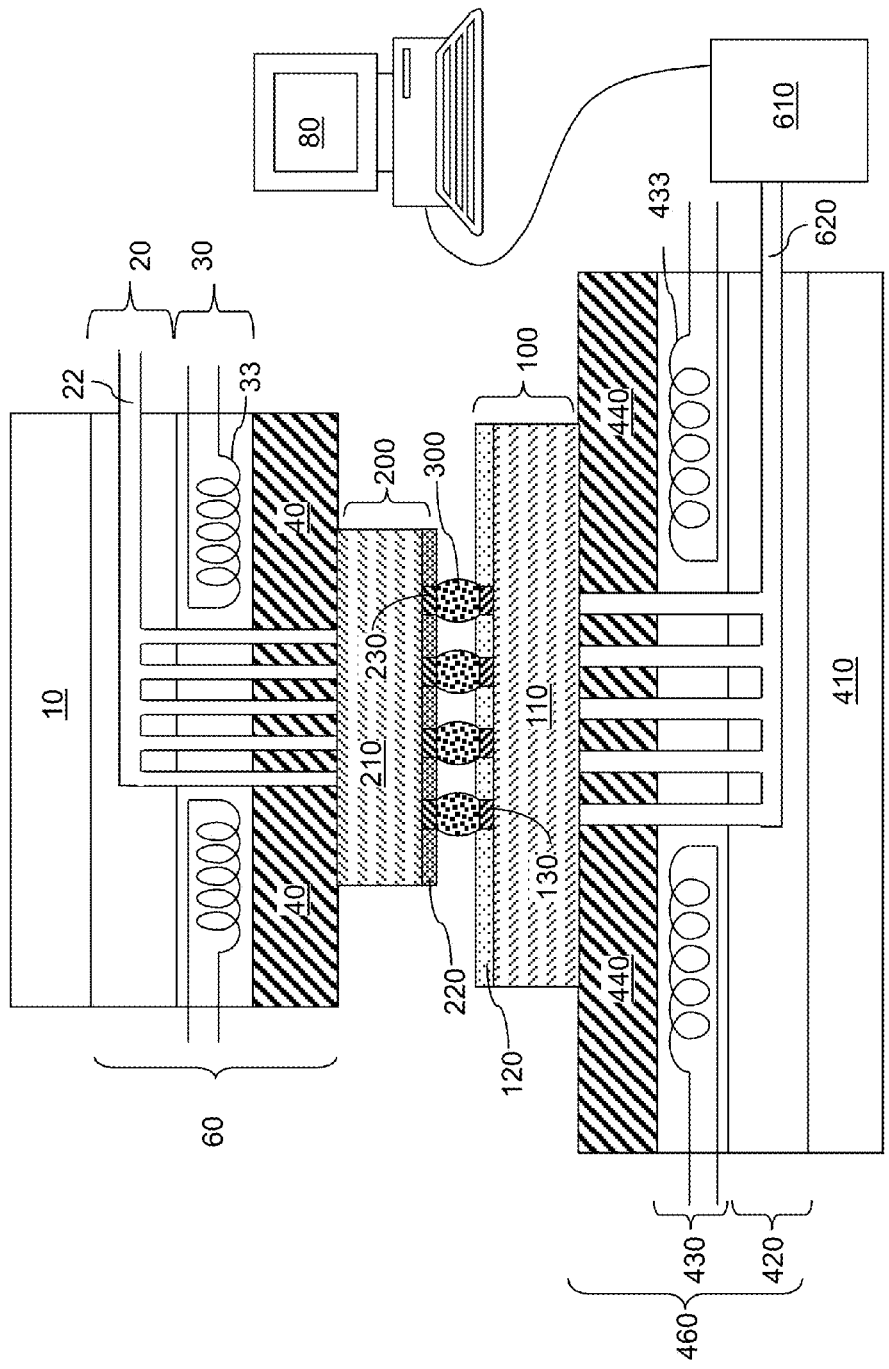
FIG. 2 is a schematic vertical cross-sectional view of a second exemplary apparatus that can be employed for bonding a first substrate to a second substrate according to a second embodiment of the present disclosure.

Referring to FIG. 2, a second exemplary apparatus according to a second embodiment of the present disclosure includes a chip bonder configured to hold, and bond, a first substrate 100 and a second substrate 200. The second exemplary structure includes a bonder head 60, the first substrate 100, an array of solder material portions 300, the second substrate 200, and a base plate 460 that functions as a platform to support the first substrate 100. A back side of the second substrate 200 can be attached to the bottom side of the bonder head 60 by vacuum suction. A bonder head movement actuator 10 configured to provide vertical movement of the bonder head 60 relative to the base plate 460 can be located above the bonder head 60. The first substrate 100 can be any of a semiconductor chip, an interposer, or a packaging substrate. The second substrate 200 can be any of a semiconductor chip, an interposer, or a packaging substrate.

The bonder head movement actuator 10 can operate to enable the vertical movement of the bonder head 60 and the second substrate 200 relative to the base plate 460 and the first substrate 100. The array of solder material portions 300 is bonded to one of the first substrate 100 or the second substrate 200 prior to the bonding step. Optionally, the bonder head movement actuator 10 may be configured to enable a lateral movement of the bond head 60 and the second substrate 200. The bonder head movement actuator 10 can be configured to provide upward and downward vertical movement of the bonder head 60 relative to the base plate 460.

The bonder head 60 can include a bonder head thermally conductive plate 40, a bonder head heater assembly 30 that includes at least one bonder head heating coil 33, and a chip support mechanism 20. The bonder head heater assembly 30 can be configured to generate and transmit heat to the bonder head conductive plate 40 by conduction and/or radiation and/or convection.

The chip support mechanism 20 holds the second substrate 200 upside down. The chip support mechanism 20 can include a vacuum manifold 22 that extends through the bonder head conductive plate 40 and to at least one hole located on the bottom surface of the bonder head conductive plate 40. The opposite end of the vacuum manifold 22 includes at least one vacuum connection port that is configured to be connected to a vacuum pump (not shown). The vacuum suction provided to the back side of the second substrate 200 can mechanically support the second substrate 200. Alternately, any other chip support mechanism 20 that is capable of mechanically supporting the second substrate 200 can be employed instead of the substrate support mechanism employing vacuum pumping.

The bonder plate 460 is configured to hold the first substrate 100 upright under the horizontal plane of the bottommost surface of the second substrate 200. The first substrate 100 is held upright so that an exposed surface of the first surface dielectric layer 120 is located at the topmost portion of the first substrate 100 and faces the bottommost surface of the second substrate 200.

The base plate 460 includes a base thermally conductive plate 440, a base plate heater assembly 430 that includes at least one base plate heating coil 433, and a substrate support mechanism 420. The first substrate 100 can be held at a fixed location by the base plate 460. A base plate movement actuator 410 may be located beneath the base plate 460, and may be configured to move the base plate 460 laterally and/or vertically.

The base plate heater assembly 430 is configured to generate and transmit heat to the base conductive plate 440 by conduction and/or radiation and/or convection. Typically, the base plate heater assembly 430 is configured to transmit heat to the base conductive plate 440 by conduction. The at least one base plate heating coil 433 is electrically connected to an electrical power source (not shown) that provides electrical power in the form of direct current (DC) or alternate current (AC).

The substrate support mechanism 420 holds the first substrate 100 in the upright position. The substrate support mechanism 420 can include a vacuum manifold 620 that extends through the base conductive plate 440 and to at least one hole located on the bottom surface of the base conductive plate 440. The opposite end of the vacuum manifold 620 includes at least one vacuum connection port that is configured to be connected to a vacuum pump 610. The vacuum suction provided to the back side of the first substrate 100 can mechanically support the first substrate 100. Alternately, any other substrate support mechanism 420 that is capable of mechanically supporting the first substrate 100 can be employed instead of the substrate support mechanism employing vacuum pumping.

The at least one bonder head heating coil 33 and the at least one base plate heating coil 433 collectively constitute a heating means for heating an assembly of the first substrate 100, the array of solder balls 300, and the second substrate 200. The base conductive plate 440 constitutes a supporting means for supporting the first substrate 100. The base conductive plate 440 includes a planar top surface that maintains flat the back side surface of the first substrate 100 in combination with the vacuum suction provided in the vacuum manifold 620. The combination of the vacuum pump 610, the vacuum manifold 620, and the base conductive plate 440 constitutes a clamping means for clamping the back side surface of the first substrate 100 to the planar top surface of the base conductive plate 440. The clamping means is configured to hold the back side surface of the first substrate 100 coplanar with the planar top surface of the base conductive plate 440 while the first substrate 100 is clamped.

During a heat-up step, a reflow step, and an initial period of a cool down step, the back side surface of the first substrate 100 is clamped to a planar surface, which is the top planar surface of the base conductive plate 440. The back side surface of the first substrate 100 remains coplanar with the top planar surface of the base conductive plate 440 while the first substrate 100 is clamped. The vacuum suction is provided by the vacuum manifold 620 that extends from the vacuum pump 610 to the back side surface of the first substrate 100.

Subsequently, the first substrate 100 is bonded to the second substrate 200 through the array of solder balls 300 by reflowing the array of solder balls 300 at a reflow temperature, which is a temperature greater than the melting temperature of the array of solder balls 300. The first substrate 100, the second substrate 200, and the array of solder balls 300 form a bonded assembly (100, 200, 300) after bonding.

The bonded assembly (100, 200, 300) is cooled below the reflow temperature to a release temperature that is greater than room temperature while the back side surface of the first substrate 100 remains clamped. The clamping of the back side of the first substrate 100 is released at the release temperature. The supporting means and the clamping means are configured to allow free bending of the assembly upon release of the clamping. The bonded assembly (100, 200, 300) is released from bonder head 60 after the reflow step. The bonded assembly (100, 200, 300) can be released from the bonder head 60 prior to the release of the clamping on the first substrate 100 from base plate 460, or simultaneously with the release of the clamping on the first substrate 100 from base plate 460.

The timing of the release of clamping can be controlled by a control means 80, which can be, for example, a microprocessor, a microcontroller, or a computer. The control means 80 is configured to release the clamping of the back side of the first substrate 100 at the release temperature that is greater than room temperature. The control means 80 can be preprogrammed to release the clamping after a predefined time period following the reflow process. The predefined time period can be determined based on measured cooling characteristics of the chip bonder. Alternately, the control means 80 can be configured to monitor the temperature of the first substrate 100 or the base conductive plate 440 through sensors (not shown) and to control the operation of the vacuum pump 610 so that the vacuum pump 610 is turned off or the vacuum manifold 620 is vented at the release temperature.

Figure 3:
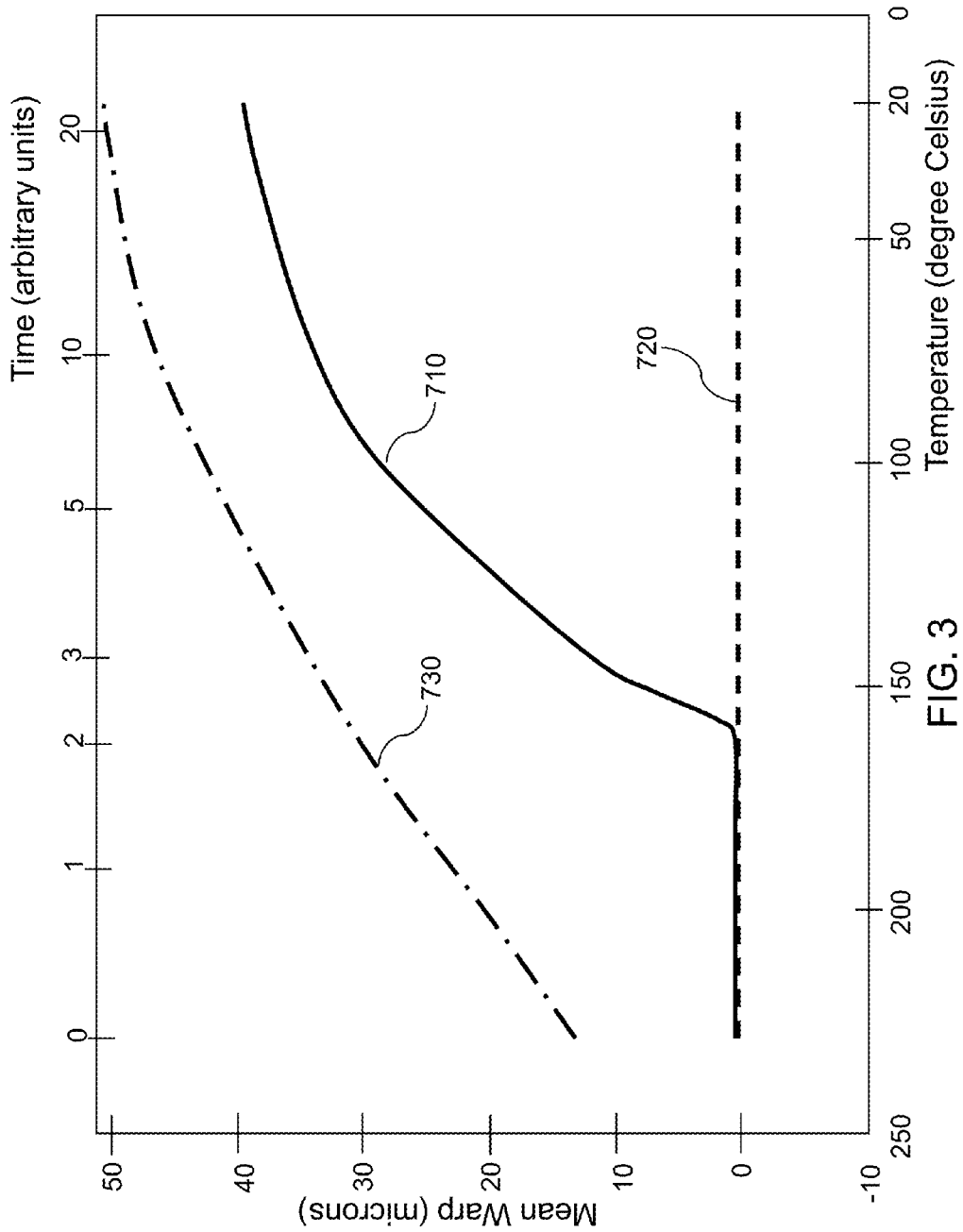
FIG. 3 is a graph illustrating the mean warp of a packaging substrate under various bonding methods.

Referring to FIG. 3, the mean warp of a packaging substrate under various bonding methods is schematically illustrated. The mean warp of a packaging substrate is plotted against temperature during a cool down step after a reflow step of a bonding process for various bonding methods that employ different types of constraint on the packaging substrate. For each temperature represented by a linear temperature scale in a bottom horizontal line of the graph, the corresponding time is indicated by a non-linear time scale in a top horizontal line of the graph.

A first curve 710 represents the mean warp of a packaging substrate when the packaging substrate is employed as the first substrate 100 and a semiconductor chip is employed as the second substrate 200 in the first and second embodiments described above. A second curve 720 represents the warp of a constrained packaging substrate that is held flat throughout the entire period of the cool down temperature, i.e., until the bonded assembly is cooled to room temperature. The constrained packaging substrate is allowed to laterally slip to prevent breakage of the packaging substrate. A third curve 730 represents the warp of a free packaging substrate that is bonded without flattening the back side surface of the packaging substrate. In other words, the free packaging substrate was not constrained or flattened in any way during bonding. The free packaging substrate suffers from yield loss due to non-uniformity of the height of the array of solder balls between the first substrate and the second substrate.

The third curve 730 shows that the free packaging substrate has a mean concave warp of about 12 microns at a reflow temperature of about 225 degrees Celsius, and about 50 microns at 25 degrees Celsius. The thermal warp, i.e., the change in warp, in the temperature range from 225 degrees Celsius and 25 degrees Celsius is about 38 microns. The variations in the absolute warp can be characterized statistically, and 1 sigma in the absolute warp can be on the order of about 25 microns. The third curve 730 shows how the warp behaves in a free-standing unconstrained packaging substrate during a cool down step.

The second curve 720 shows the warp behavior for a constrained packaging substrate when held down by a clamping means until the constrained packaging substrate cools down to room temperature. The warp of the packaging substrate, when constrained until the end of the cool down step at room temperature, is nearly perfectly zero throughout the heat-up step, the reflow step, and the cool down step.

The first curve 710 shows the warp behavior of a packaging substrate subjected to the processing methods of the first or second embodiments of the present disclosure. The warp of the packaging substrate is nearly perfectly zero throughout the heat-up step, the reflow step, and an initial period of the cool down step until the temperature of the packaging substrate reaches a release temperature, which is 165 degrees Celsius in this example. The clamping is released at the release temperature, and the packaging substrate is allowed to warp during a latter period of the cool down step, i.e., when the temperature of the packaging substrate is below the release temperature. Once the packaging substrate is unclamped, i.e., released from clamping, the warp of the packaging substrate changes toward the warp of a packaging substrate in a free state, i.e., the warp represented by the third curve 730. However, the warp of the unclamped packaging substrate is less than the warp of a free-standing packaging substrate because some warp is absorbed by the array of solder balls and the second substrate during the initial period of the cool down step. Thus, the difference between the warp of the third curve 730 and the warp of the first curve 710 at 25 degrees Celsius is the result of a forced warp relaxation occurring due to the packaging substrate being forced flat at the reflow temperature.

A zero absolute warp at the reflow temperature according to embodiments of the present disclosure means that the sigma of the warp at the reflow temperature is necessarily zero. Hence, use of clamping according to embodiments of the present disclosure provides zero absolute warp, zero thermal warp, and zero sigma warps at reflow. Zero warp at reflow provides a significant benefit for die attachment by removing one of the major influencing factors for C4 non-wetting. Thus, the yield from a bond and assembly (B&A) process can approach 100%. Such a benefit means that tolerance on other processing parameters can be relaxed such as C4 height coplanarity, flip chip attach (FCA) coplanarity, solder volume uniformity, etc. Further, all EG (electrically good) laminates can be used employing the methods of embodiments of the present disclosure irrespective of warp. Thus, substrate suppliers can increase yield, and lower the cost, of laminates employed for the packaging substrates.

Figure 4:
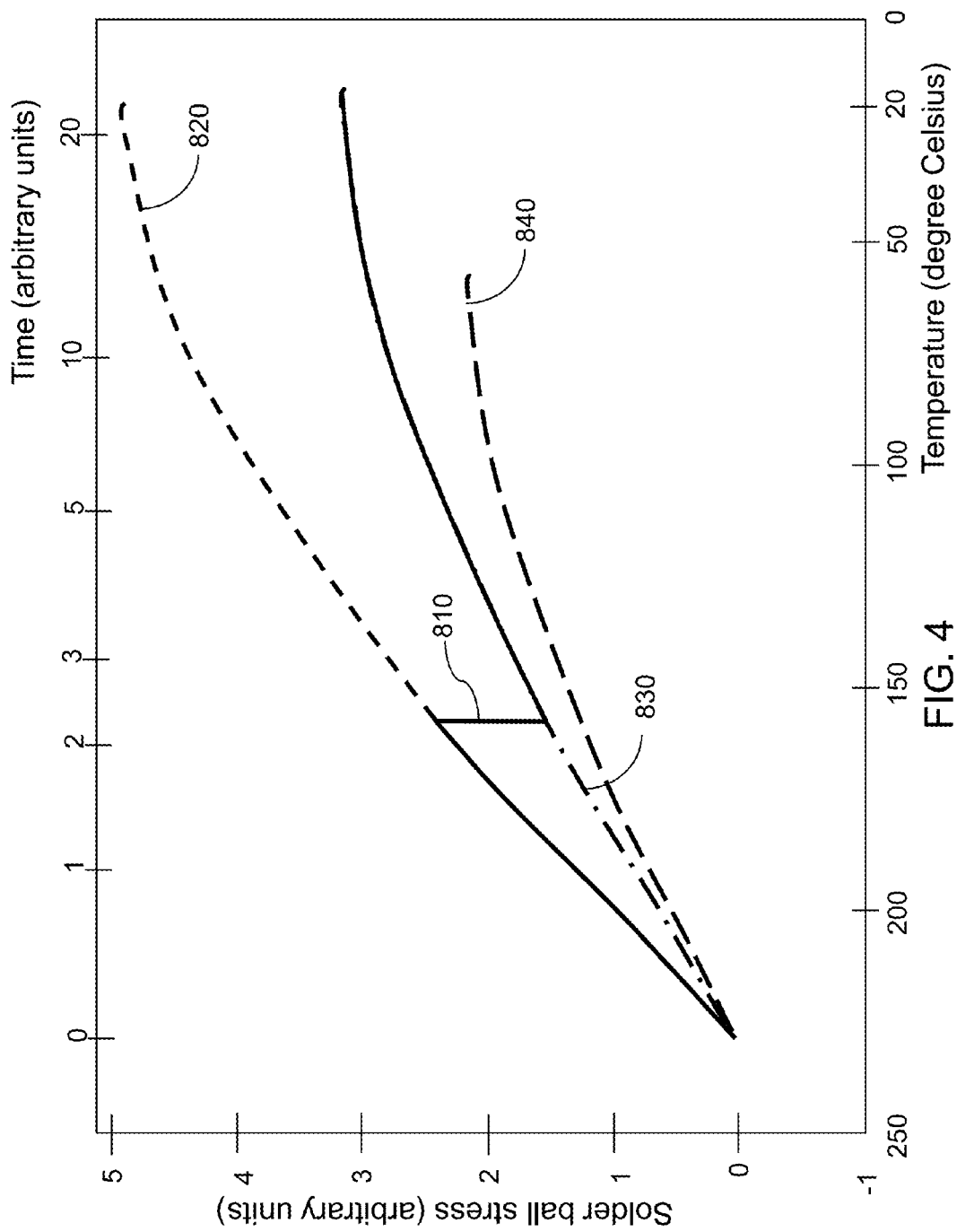
FIG. 4 is a graph illustrating the stress on solder balls under various bonding methods.

Referring to FIG. 4, the stress on solder balls under various bonding methods is schematically illustrated. A first curve 810 represents the stress on solder balls when the packaging substrate is employed as the first substrate 100 and a semiconductor chip is employed as the second substrate 200 in the first and second embodiments described above. A second curve 820 represents the stress on solder balls when the packaging substrate that is held flat throughout the entire period of the cool down temperature, i.e., until the bonded assembly is cooled to room temperature, while allowing lateral slipping of the packaging substrate to prevent breakage of the packaging substrate. A third curve 830 represents the stress on solder balls when a free packaging substrate is employed, i.e., when the packaging substrate is bonded without flattening the back side surface of the packaging substrate. The free packaging substrate suffers from yield loss due to non-uniformity of the height of the array of solder balls between the first substrate and the second substrate. A fourth curve 840 represents the stress on solder balls when the packaging substrate that is held flat throughout the entire period of the cool down temperature while lateral slipping of the packaging substrate is prevented. By limiting the slippage of the packaging substrate, the thermal shrinkage in the lateral dimension of the packaging substrate is suppressed, and therefore, the thermal contraction of the top surface of the packaging substrate is minimized. Thus, the stress on the solder balls in the fourth curve 840 can be less than the stress on the solder balls in the third curve 830, which represents a packaging substrate that is allowed to contract during the cool down step. However, the suppression of the thermal contraction in the case of the fourth curve induces substantial increase in the stress within the packaging substrate, which is laterally constrained not to move. Thus, the fourth curve 840 can end when the packaging substrate breaks under severe stress before the bonded assembly cools down to room temperature. The method of the fourth curve 840 typically results in a structural damage to the packaging substrate or the constraint mechanism, which can be, for example, a glass platen or a glass sheet.

The first curve 810 represents embodiments of the present disclosure. The packaging substrate is clamped, i.e., constrained, such that the back side surface of the packaging substrate is held flat against a planar surface while being allowed to laterally slip, during a heat-up step, a reflow step, and an initial period of cool down until the release temperature is reached. Thus, the first curve 810 coincides with the second curve 820 until the release temperature is reached.

Upon release of the clamping, the packaging substrate becomes unconstrained. Thus, the full effect is manifested of the mismatch of thermal coefficients of expansion between the first substrate (packaging substrate) and the second substrate. The bonded substrate becomes free to bend upon releasing of the clamping at the release temperature, which is reached after the solder balls have solidified sufficiently to be able to maintain substantially the same shapes. Thus, the stress on the solder balls according to the first curve 810 becomes substantially the same as the stress on the solder balls according to the third curve 830 after the release of the clamping, thereby reducing the stress on the solder balls relative to the second curve 820 and preventing cracks on the solder balls or metal interconnect structures attached to the solder balls.

Figure 5:
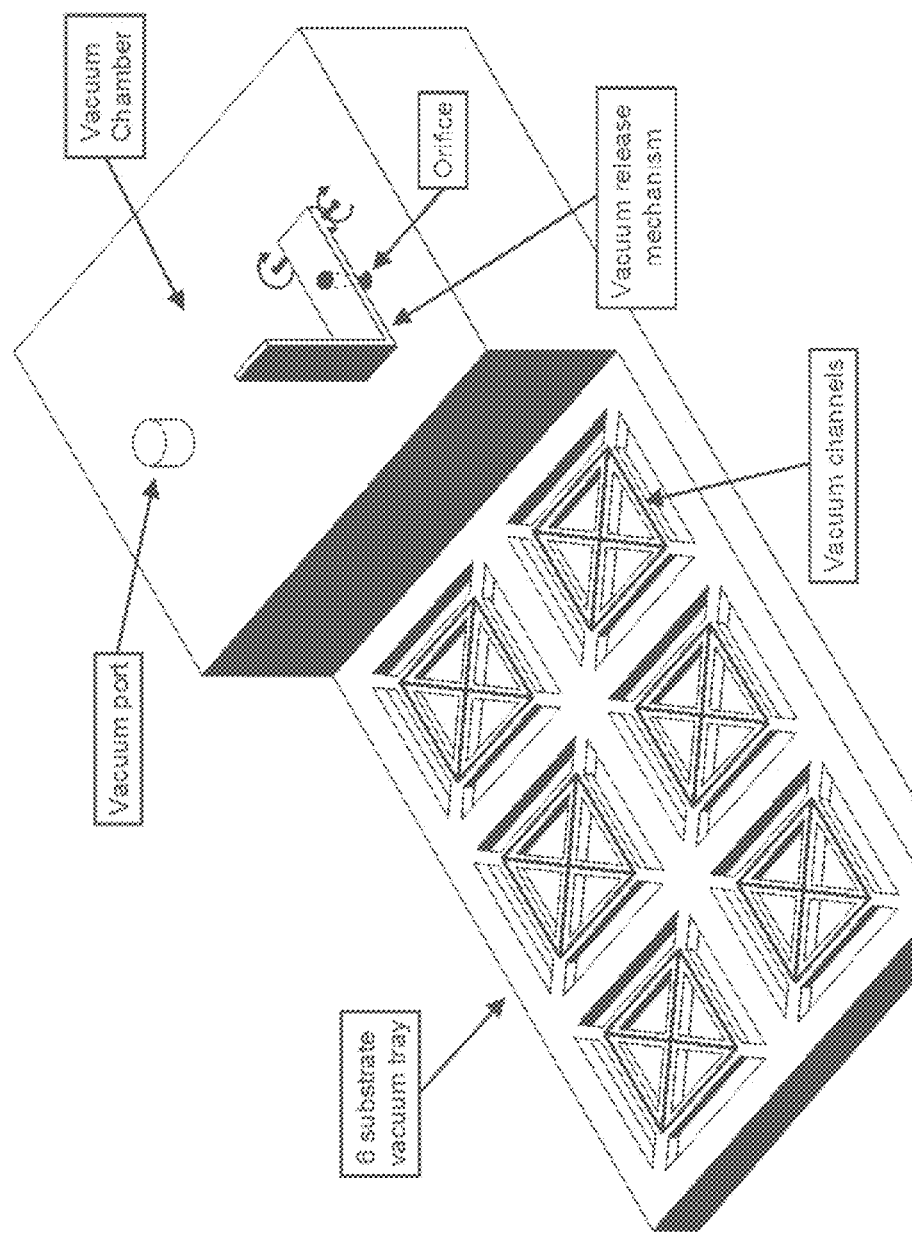
FIG. 5 is a bird's eye view of an exemplary substrate carrier configured to hold substrates for bonding according to an embodiment of the present disclosure.

Referring to FIG. 5, an exemplary substrate carrier according to an embodiment of the present disclosure is schematically illustrated. The exemplary substrate carrier is configured to hold substrates, i.e., a stack of aligned pre-bonding assembly as illustrated in FIGS. 1 and 2, for bonding.

The exemplary substrate carrier can be employed in a reflow oven. The reflow oven can be operated as a high-throughput linear device such that substrate carriers enter the reflow oven from one end and exits from the other end of the oven. In this configuration, the ability to provide vacuum for a substrate carrier through a fixture, such as a vacuum manifold 622 illustrated in FIGS. 1 and 2, may be limited.

In this embodiment, vacuum suction to one or more first substrate 100 (See FIGS. 1 and 2) can be provided by the substrate carrier. Specifically, the substrate carrier is designed to include a vacuum enclosure, i.e., a vacuum chamber. The vacuum enclosure is configured to employ the back side or front side surface(s) of one or more first substrates as (a) sealing surface(s). For example, the back side surface of the first substrate 100 as illustrated in FIGS. 1 and 2 can be employed as a sealing surface.

The vacuum enclosure provides a reservoir for the vacuum while the substrate carrier passes through the reflow oven. The size of such a chamber would be chosen such that the vacuum is not depleted (due to leakage) during the time period in which the substrate carrier is in the oven. While the exemplary substrate carrier is illustrated in FIG. 5 for mounting six packaging substrates, a substrate carrier can have numerous design variations to accommodate various numbers of packaging substrates and/or design variations in the shapes of the packaging substrate(s). The vacuum reservoir is integral with the substrate carrier.

In the exemplary substrate carrier illustrated in FIG. 5, six packaging substrates (not shown) are held down by vacuum channels that are machined in the frame of the carrier. The frame is shown as ribbed so as to provide the necessary exposure of the bottom of the packaging substrates to the heating medium. Alternately, the frame can be made of solid metal. The vacuum chamber is integral with, and adjacent to, the substrate clamping area. A vacuum port is provided to enable pulling of vacuum in the vacuum enclosure, which is sealed by mounting the six packaging substrates. While the vacuum is pulled, the packaging substrates (corresponding to the first substrate 100 in FIGS. 1 and 2) are positioned over the clamping area, and semiconductor chips are placed on the flip chip area (FCA) of the packaging substrate. At this point the vacuum enclosure is sealed and the mechanism that provides the vacuum is removed, and then the substrate carrier including the six stacks of aligned pre-bonding assembly is sent through the reflow oven.

In general, a substrate carrier can be configured to form an encapsulated vacuum enclosure therein by combining with at least one substrate (e.g., packaging substrates). The combination of the substrate carrier and the at least one substrate can be performed in a geometry in which each back side or front side surface of the at least one substrate is combined with surfaces of a cavity within the substrate carrier to form and seal the encapsulated vacuum enclosure.

A vacuum release mechanism configured to break the sealed encapsulated vacuum enclosure can also be provided. For example, the vacuum release mechanism can be an orifice in the chamber that is blocked by a needle valve. The needle valve is attached to a vacuum release mechanism. For example, a stationary bar located in the reflow oven can knock this mechanism backwards as the substrate carrier passes beneath it, thereby releasing the vacuum suction.

The substrate carrier can be a portable substrate carrier that can hold packaging substrates with a vacuum suction until the packaging substrates cool down to a release temperature or until the substrate carrier passes through a predefined position at which the temperature of the packaging substrates is at a predefined temperature lower than the reflow temperature. Thus, the vacuum suction on the bonded assemblies can be released in a timely manner during the cool down step, i.e., at or around the release temperature. The substrate carrier contains a vacuum reservoir, and is compatible with traditional high through-put linear reflow ovens.

Referring to FIGS. 6A-6C, various means are schematically illustrated for providing a vacuum sealing between a substrate carrier 660 and the first substrate 100 of a bonded substrate.

FIG. 6A illustrates an embodiment in which the vacuum seal is provided between the back side of a first substrate 100 and a planar surface of the substrate carrier 660. The vacuum seal may be positioned anywhere in the region between the FCA (flip chip area) and the perimeter of the first substrate 100. The vacuum seal can be implemented employing a vacuum seal element 680, which can be, for example, an O-ring compatible with vacuum applications. The FCA of the first substrate 100 is clamped coplanar with the planar surface of the substrate carrier 660. The end of the vacuum manifold 620 that is connected to the vacuum pump 610 can be provided with a self-sealing plug, which can be, for example, of the same type as the self-sealing plug on vehicle tires or on commercial soccer balls or basketballs.

FIG. 6B illustrates another embodiment in which the vacuum seal is provided at the perimeter of the first substrate 100 so that the vacuum sealing occurs at the vertical edge of the first substrate 100. Here the force that the vacuum seal exerts on the first substrate 100 is oriented along the horizontal plane of the first substrate 100.

FIG. 6C illustrates yet another embodiment in which the vacuum seal is provided over the first substrate 100 and at the planar top surface of the substrate carrier 660. The sealing takes place at two places—between the vacuum seal element 680 and the front side of the first substrate 100 and between the vacuum seal element 680 and the top of the planar surface of the substrate carrier 660. The vacuum seal exerts a downward force, thereby pushing the first substrate 100 against the planar top surface of the substrate carrier 660.

In another embodiment of the present disclosure, mechanical clamping devices can be used to hold a substrate flat against a planar surface in lieu of vacuum suction. One or more mechanical clamping devices, such as one or more clamps, can be used to control the absolute, thermal and sigma of the warp in a manner similar to vacuum clamping.

Figure 7A:
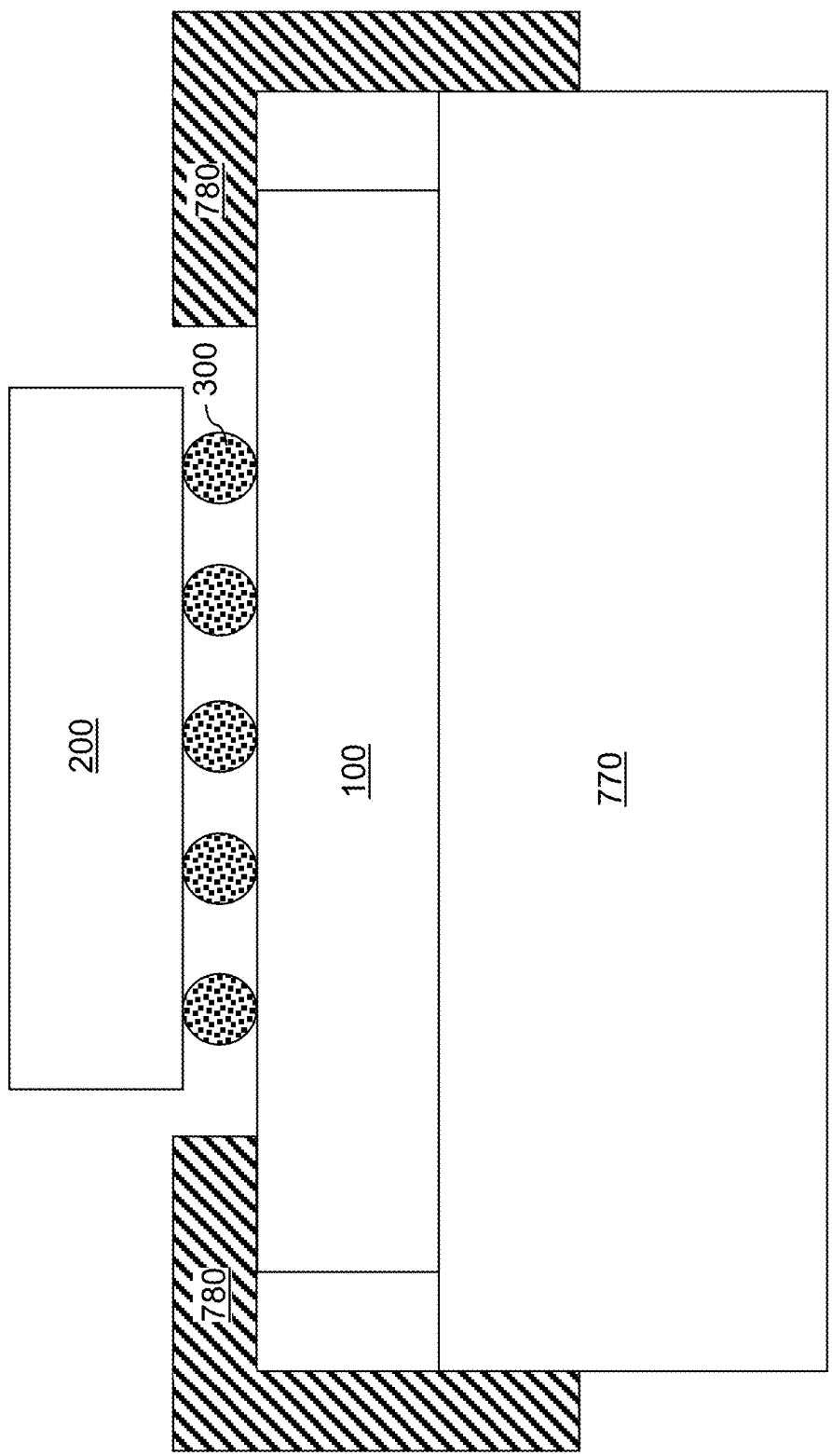
FIG. 7A is a vertical cross-sectional view of an assembly of a bonded substrate, a vacuum chuck, and a pair of mechanical clamps while a packaging substrate is clamped according to an embodiment of the present disclosure.
Figure 7B:
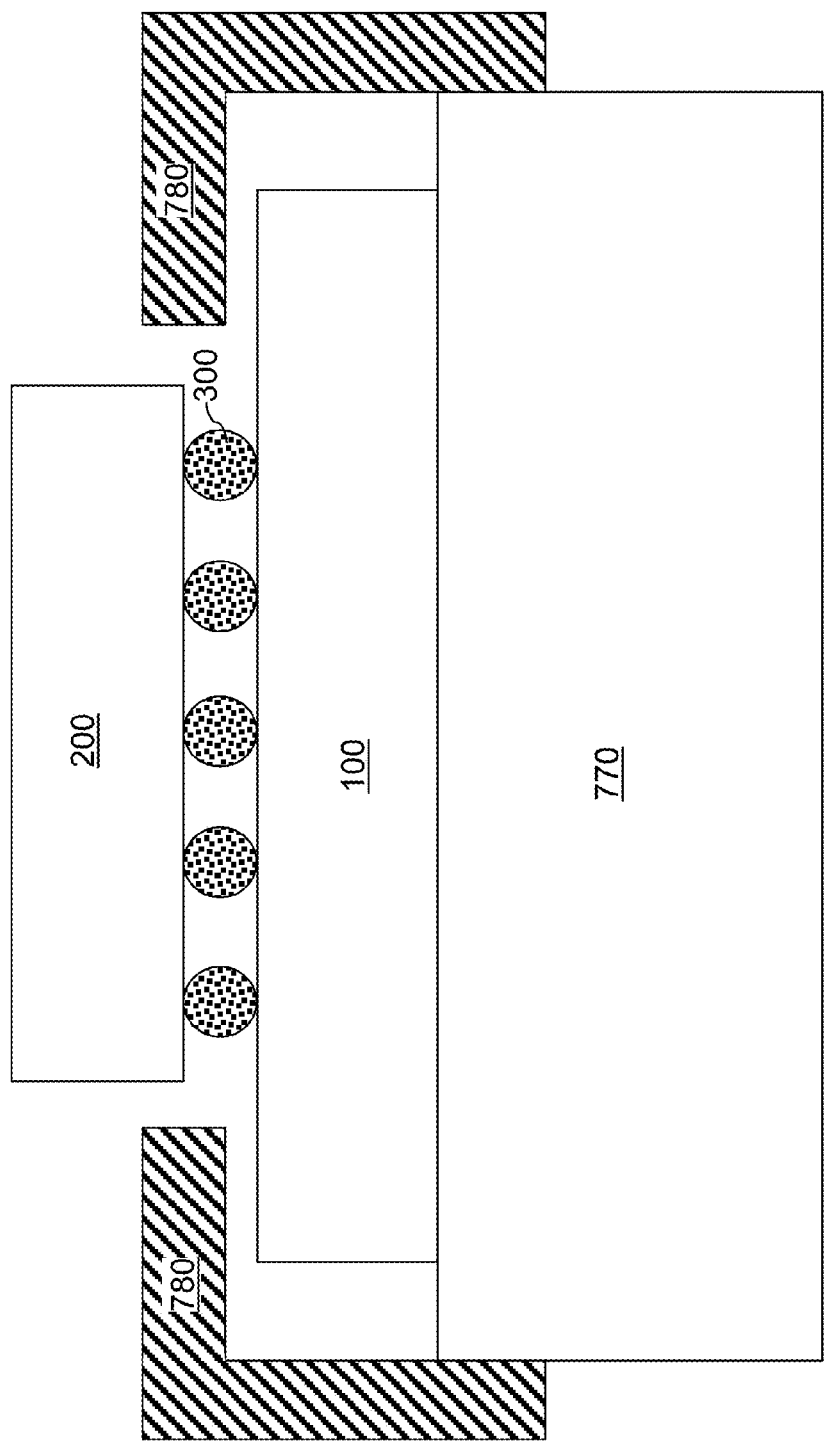
FIG. 7B is a vertical cross-sectional view of an assembly of a bonded substrate, a vacuum chuck, and a pair of mechanical clamps while a packaging substrate is unclamped according to an embodiment of the present disclosure.

Referring to FIG. 7, an assembly is shown of a bonded substrate (100, 200, 300), a platen (or a chuck) 770, and at least one mechanical clamping device 780. In one embodiment, the at least one mechanical clamping device 780 can be configured to press the back side surface of the first substrate 100 against the planar surface of the platen 770 in one state, and not to press the back side surface of the first substrate 100 against the planar surface of the platen 770 in another state.

In one embodiment, the combination of the platen 770 and the at least one mechanical clamping device 780 can replace the vacuum chuck 530 of the first embodiment, or the base conductive plate 440 of the second embodiment. The at least one mechanical clamping device 780 is shown in a clamped position in FIG. 7A, and is shown in an unclamped (released) position in FIG. 7B.

A control means is provided to enable the release of the at least one mechanical clamping device 780 from the packaging substrate at a release temperature. The timing of the release of the packaging substrate is selected to avoid undue build-up of stress and/or strain in the packaging substrate and the array of solder balls. In one embodiment, the at least one mechanical clamping device 780 can restrict the lateral expansion or contraction of the first substrate 100 relative to the platen 770.

The same methods as the first and second embodiments can be employed to form a bonded assembly of the first substrate 100, the second substrate 200, and the array of solder balls 300 by employing mechanical clamping instead of vacuum clamping. Specifically, the same heating means can be employed for heating an assembly of the first substrate 100, the array of solder balls 300, and the second substrate as in the first and second embodiments. The platen 770 can be employed as a supporting means for supporting the first substrate 100. The at least one mechanical clamping device 780 is employed as a clamping means for clamping the back side surface of the first substrate 100 to the top planar surface of the platen 770, and to hold the back side surface of the first substrate 100 coplanar with the planar top surface of the platen 770 while the first substrate 100 is clamped. Further, the same control means 80 as in the first and second embodiments can be employed for releasing clamping of the back side of the first substrate 100 at a release temperature that is greater than room temperature. The supporting means and the clamping means are configured to allow free bending of the assembly upon release of the clamping.

Referring to FIG. 8, an assembly of a bonded substrate (100, 200, 300), an adhesive layer 880, a transparent chuck 870, and an irradiation means 850 configured to remove or deactivate the adhesive layer 880 are shown during a cool down step after a reflow step according to an embodiment of the present disclosure. The combination of the assembly of the bonded substrate (100, 200, 300), the adhesive layer 880, the transparent chuck 870 can be employed in combination with a furnace as in the first embodiment, or in combination with a chip bonder as in the second embodiment. The vacuum clamping of the first and second embodiments or the mechanical clamping of the embodiment of FIG. 7 can be replaced with clamping of the first substrate 100 with the adhesive layer 880 during a heat-up step, a reflow step, and an initial period of a cool down step until a release temperature is reached.

Thus, the clamping is provided by the adhesive layer 880 contacting the back side surface of the first substrate 100 and the planar top surface of the transparent chuck 870. At the release temperature, adhesive strength of the adhesion layer 880 is reduced at the release temperature by irradiation of electromagnetic radiation 860, such as a laser beam, emitted by a radiation beam source 850. The electromagnetic radiation 860 can ablate substantially all or a significant portion of the adhesion layer 880 so that the first substrate 100 is mechanically unconstrained, i.e., unclamped, from the adhesive layer 880.

In one embodiment, the assembly of the bonded substrate (100, 200, 300), the adhesive layer 880, the transparent chuck 870 can be configured to move in a direction relative to the radiation beam source 850. The movement of the assembly and/or the timing of the emission of the electromagnetic radiation 860 by the electromagnetic radiation source 850 can be controlled by a control means 80, which can be a computer or a microprocessor configured to monitor the temperature of a furnace or a chip bonder. The radiation beam source 850 can be configured to irradiate the electromagnetic radiation 860 toward the back side surface of the first substrate 100 through the transparent chuck 870.

During the heat-up step, the reflow step, and the initial period of the cool down step above the release temperature, the back side surface of the first substrate 100 is clamped to a planar surface, which is the top surface of the transparent chuck 870, wherein the back side surface remains coplanar with the planar surface of the transparent chuck 870 while the first substrate 100 is clamped. During the reflow step, the first substrate 100 is bonded to the second substrate 200 through the array of solder balls 300, and the first substrate 100, the second substrate 200, and the array of solder balls 300 form a bonded assembly (100, 200, 300). The bonded assembly (100, 200, 300) is cooled below the reflow temperature to a release temperature that is greater than room temperature while the back side surface of the first substrate 100 remains clamped to the transparent substrate 870 by the adhesive layer 880. The clamping of the back side of the first substrate 100 is released at the release temperature by the electromagnetic radiation 860 that passes through the transparent substrate 870 during irradiation of the adhesive layer 880.

The release temperature can be the same in all embodiments. Correspondingly, the ratio of the difference between the release temperature and 25 degrees Celsius to the difference between a melting temperature of the array of solder balls and 25 degrees Celsius can be the same in all embodiments, i.e., can be from 0.50 to 0.90.

The adhesive layer 880 and the transparent chuck 870 can be employed as parts of an apparatus for bonding substrates. The apparatus can include a heating means for heating an assembly of the first substrate 100, the array of solder balls 300, and the second substrate as in the various embodiment of the present disclosure. The transparent chuck 870 functions as a supporting means for supporting the first substrate 100 such that the back side of the first substrate 100 remains flat when attached to the transparent chuck 870 through the adhesive layer 880. The electromagnetic radiation source 850 functions as a release means for releasing the back side surface of the first substrate 100 from the planar top surface of the transparent chuck 870 from a clamped state in which the back side surface is held coplanar with the planar top surface while the first substrate 100 is clamped. Further, the apparatus can include a control means 80 for activating the release means at a release temperature that is greater than room temperature.

While the disclosure has been described in terms of specific embodiments, it is evident in view of the foregoing description that numerous alternatives, modifications and variations will be apparent to those skilled in the art. Each of the various embodiments of the present disclosure can be implemented alone, or in combination with any other embodiments of the present disclosure unless expressly disclosed otherwise or otherwise impossible as would be known to one of ordinary skill in the art. Accordingly, the disclosure is intended to encompass all such alternatives, modifications and variations which fall within the scope and spirit of the disclosure and the following claims.

What is claimed is:

1. A method of bonding substrates, said method comprising:
   clamping a back side surface of a first substrate to a planar surface, wherein said back side surface remains coplanar with said planar surface while said first substrate is clamped;
   bonding said first substrate to a second substrate through an array of solder balls that contact by reflowing said array of solder balls at a reflow temperature, wherein said first substrate, said second substrate, and said array of solder balls form a bonded assembly;
   cooling said bonded assembly below said reflow temperature to a release temperature that is greater than room temperature while said back side surface of said first substrate remains clamped; and
   releasing of said clamping of said back side of said first substrate at said release temperature.

2. The method of claim 1, wherein said bonded assembly freely bends upon said releasing of said clamping.

3. The method of claim 1, wherein said clamping is provided by a vacuum suction provided to said back side surface of said first substrate.

4. The method of claim 3, wherein said vacuum suction is provided by a vacuum manifold that extends from a vacuum pump to said back side surface of said first substrate.

5. The method of claim 3, said vacuum suction is provided by a substrate carrier including a vacuum enclosure configured to employ a surface of said first substrate as a sealing surface.

6. The method of claim 5, wherein said clamping of said back side of said first substrate is released by venting said vacuum enclosure at said release temperature.

7. The method of claim 1, wherein said clamping is provided by at least one mechanical clamping device.

8. The method of claim 7, wherein said at least one mechanical clamping device is configured to press said back side surface of said first substrate against said planar surface in one state, and not to press said back side surface of said first substrate against said planar surface in another state.

9. The method of claim 1, wherein said clamping is provided by an adhesive layer contacting said back side surface of said first substrate and said planar surface.

10. The method of claim 9, wherein adhesive strength of said adhesion layer is reduced at said release temperature by irradiation of electromagnetic radiation.

11. The method of claim 10, wherein said adhesive layer is ablated by a laser beam at said release temperature.

12. The method of claim 9, wherein said planar surface is a top surface of a transparent substrate, and said electromagnetic radiation passes through said transparent substrate during irradiation of said adhesive layer.

13. The method of claim 1, wherein said first substrate is bonded to said second substrate employing a chip bonder configured to hold said first substrate and said second substrate.

14. The method of claim 1, wherein said bonding of said first substrate to said second substrate is performed within an enclosure configured to confine heat.

15. The method of claim 1, wherein a ratio of a difference between said release temperature and 25 degrees Celsius to a difference between a melting temperature of said array of solder balls and 25 degrees Celsius is from 0.50 to 0.90.

* * * * *